US006458254B2

(12) United States Patent
Gessert

(10) Patent No.: US 6,458,254 B2
(45) Date of Patent: *Oct. 1, 2002

(54) PLASMA & REACTIVE ION ETCHING TO PREPARE OHMIC CONTACTS

(75) Inventor: Timothy A. Gessert, Conifer, CO (US)

(73) Assignee: Midwest Research Institute, Kansas City, MO (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/937,718

(22) Filed: Sep. 25, 1997

(51) Int. Cl.[7] .................. H01L 21/461; C23C 14/34
(52) U.S. Cl. ............... 204/192.35; 438/710; 438/718
(58) Field of Search ................. 438/710, 718; 204/192.35, 298.34

(56) References Cited

U.S. PATENT DOCUMENTS

| | | | | |
|---|---|---|---|---|
| 4,411,732 A | * | 10/1983 | Wotherspoon | 438/718 |
| 4,581,099 A | | 4/1986 | Fukaya et al. | 156/643 |
| 4,710,589 A | | 12/1987 | Meyers et al. | 136/258 |
| 4,766,084 A | | 8/1988 | Bory et al. | 437/3 |
| 4,838,984 A | * | 6/1989 | Luttmer et al. | 438/718 |
| 4,863,549 A | * | 9/1989 | Grunwald | 204/298.34 |
| 4,951,601 A | * | 8/1990 | Maydan et al. | 118/719 |
| 4,968,374 A | * | 11/1990 | Tsukada et al. | 204/298.34 |
| 5,002,631 A | | 3/1991 | Giapis et al. | 156/643 |
| 5,223,457 A | * | 6/1993 | Mntz et al. | 438/710 |
| 5,246,529 A | | 9/1993 | Fukasawa et al. | 156/643 |
| 5,282,902 A | * | 2/1994 | Matsuyama | 136/249 |
| 5,318,666 A | * | 6/1994 | Elkind et al. | 438/718 |
| 5,449,432 A | * | 9/1995 | Hanawa | 156/345 |
| 5,454,902 A | * | 10/1995 | Zinck et al. | 216/65 |
| 5,685,941 A | * | 11/1997 | Forster et al. | 156/345 |
| 5,846,885 A | * | 12/1998 | Kamata et al. | 438/710 |

FOREIGN PATENT DOCUMENTS

| JP | 61-100978 | * | 5/1986 | |
|---|---|---|---|---|
| JP | 64-84176 | * | 3/1989 | 250/370.01 |

* cited by examiner

Primary Examiner—Rodney G. McDonald
(74) Attorney, Agent, or Firm—Paul J. White

(57) ABSTRACT

A method of making a low-resistance electrical contact between a metal and a layer of p-type CdTe surface by plasma etching and reactive ion etching comprising:

a) placing a CdS/CdTe layer into a chamber and evacuating said chamber;

b) backfilling the chamber with Argon or a reactive gas to a pressure sufficient for plasma ignition; and c) generating plasma ignition by energizing a cathode which is connected to a power supply to enable the plasma to interact argon ions alone or in the presence of a radio-frequency DC self-bias voltage with the p-CdTe surface.

10 Claims, 9 Drawing Sheets

STATE-OF-THE-ART PROCESS SEQUENCE

IMPROVED PROCESS SEQUENCE

1 μm

1 μm

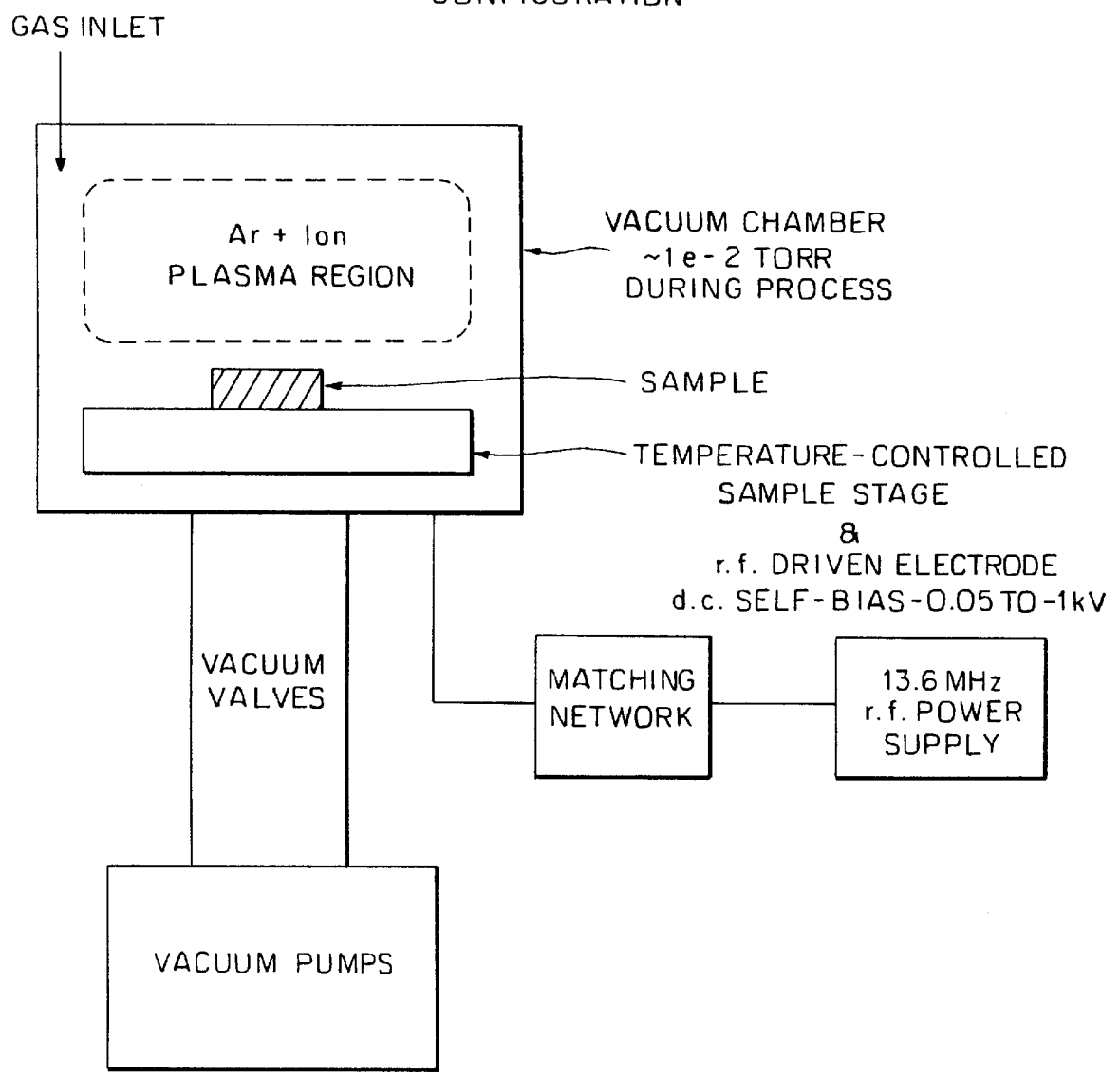

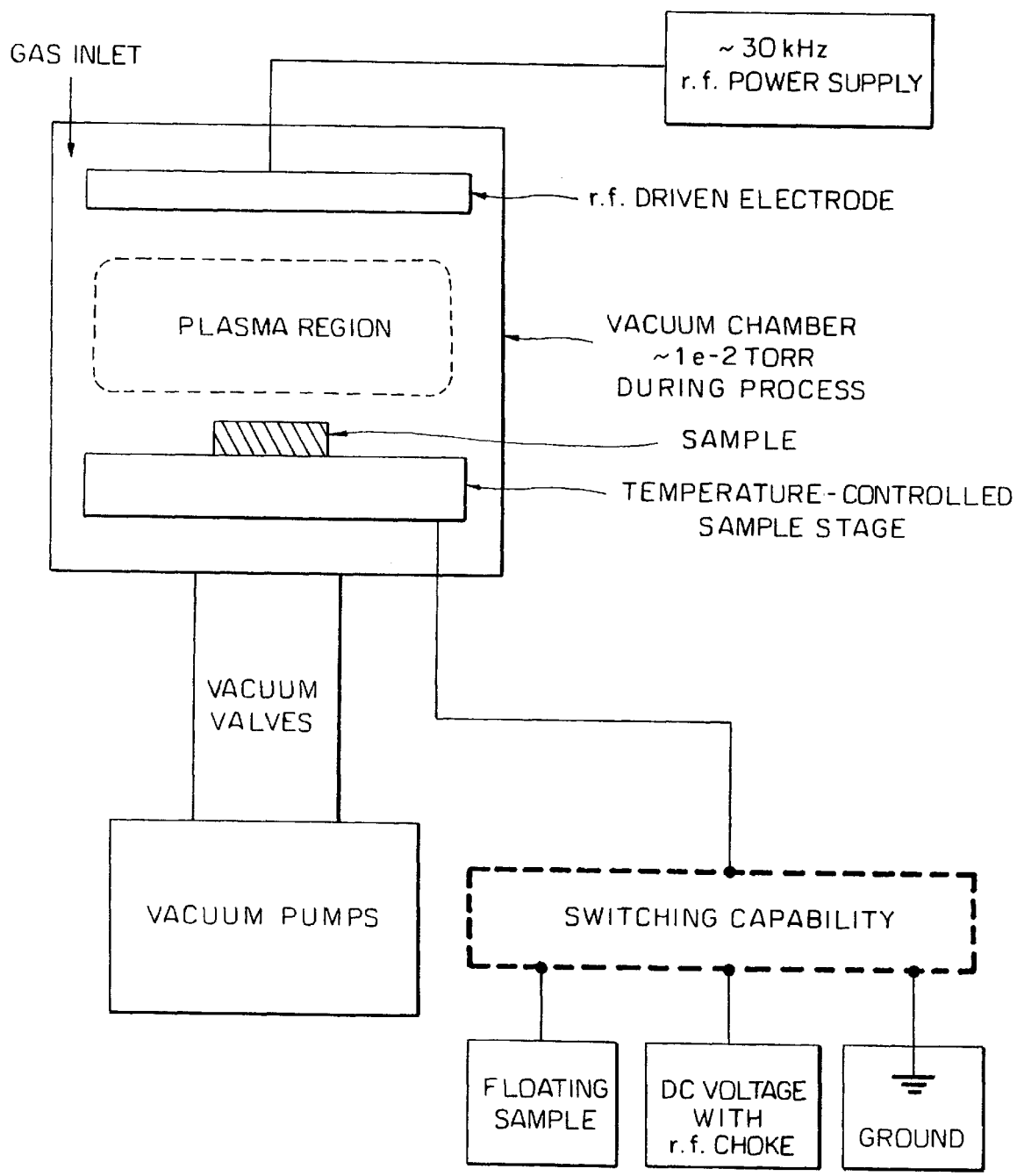

FIG. 11

POTENTIAL SURFACE REACTIONS FROM PE PROCESS

EQUATION #1

$$CdTe + Cl_2 (gas) \xrightarrow{\text{THERMAL OR PLASMA ENERGY}} CdCl_2 (\text{SURFACE LAYER}) + Te (\text{Te-rich CdTe surface})$$

EQUATION #2

$$CdCl_2 + Te + Ar \xrightarrow{\text{PLASMA BOMBARDMENT}} Te (\text{Te-rich CdTe surface}) + CdCl_2 (\text{gas phase})$$

PLASMA & REACTIVE ION ETCHING TO PREPARE OHMIC CONTACTS

CONTRACTUAL ORIGIN OF THE INVENTION

The United States Government has rights in this invention pursuant to Contract No. DE-AC36-83CH10093 between the United States Department of Energy and the Midwest Research Institute.

FIELD OF THE INVENTION

This invention relates to processes of using Plasma Etching and Reactive Ion Etching to prepare surfaces of p-CdTe thin films for application of ohmic contacts.

Plasma Etching (PE) and Reactive Ion Etching (RIE) are used to prepare the surface of p-type CdTe films so that wet chemical treatments are avoided. These processes may be used for application in preparing photovoltaic and other devices to improve performance by decreasing the losses associated with the back metal contact.

BACKGROUND OF THE INVENTION

As an alternative source of electrical energy, photovoltaic technology is under extensive industry research; however, to date, the principal reason why the potential of photovoltaic technology has not been optimally realized is due to the difficulty in preparing photovoltaic devices that efficiently convert light into electricity at costs that are competitive with conventional electrical energy sources. Still, industry is continuing to engage in research in an attempt to continually improve the efficiency and reduce the production costs of photovoltaic cells.

A typical single-junction photovoltaic cell is comprised of a substrate on which to form the device, two ohmic contacts to conduct current to an external electrical circuit, and two or more semiconductor layers in series to form the semiconductor junction. At least one of these semiconductor layers (the absorber) is chosen so that its bandgap is of a value for near-optimum conversion of solar radiation. In a typical design, one semiconductor layer is doped n-type, and the adjacent layer is doped p-type. The intimate proximity of these layers forms a semiconductor p-n junction. The p-n junction provides an electric field that facilitates charge separation in the absorber layer(s) when the cell is illuminated, and charge collection at the ohmic contacts.

In the standard photovoltaic cell including the substrate for mounting the cell and two ohmic contacts for conducting current to an external electrical circuit, in addition to the n-type layer and the p-type layer of a p-n junction cell, a three layer cell can include an intrinsic (i-type) layer disposed between the n-type layer and the p-type layer for absorption of light.

In the photovoltaic cell, the semiconductor layers may be formed from single crystalline materials, amorphous materials, or polycrystalline materials. However, single crystalline materials are preferred from an efficiency perspective, because efficiencies are available in excess of about 20% in specific single crystalline photovoltaic cells. Nevertheless, the disadvantage associated with single crystalline materials is the high cost of the material as well as the difficulty in depositing the single crystalline materials.

On the other hand, in the case of amorphous materials, one must contend with low carrier mobility, low minority carrier lifetime, low efficiency, and issues of cell stability. Therefore, while single-crystalline and amorphous materials are utilized in some photovoltaic device applications, semiconductor layers composed of polycrystalline materials are viewed as preferred alternatives for the production of photovoltaic devices that would be economically viable for wide range of applications.

Polycrystalline materials offer the most numerous advantages for the production of photovoltaic cells. However, there is a desire in the industry of the field of polycrystalline materials to increase the efficiency of the polycrystalline photovoltaic cells from the current efficiencies of from about 5–10% range to about a range of 10–15%, and ultimately to advance the efficiencies of polycrystalline photovoltaic cells closer to the 15–25% range of the single-crystalline materials.

Cadmium telluride is a semiconductor with electrical properties recognized in the industry as well suited for conversion of sunlight into electrical energy. The material has a bandgap that is nearly optimum for conversion of terrestrial radiation, and the ability to be doped n-type and p-type, that permits the formation of a large range of junction structures.

One significant technological problem with CdTe-based devices is that it is difficult to form an ohmic contact to the p-type form of the material. This is observed for both single crystalline and polycrystalline p-type CdTe, and results from a combination of large semiconductor work function, and the inability of CdTe to sustain sufficiently high p-type carrier concentration to enable quantum-mechanical tunneling of charge carriers at the CdTe/metal contact interface. In addition to these fundamental problems, the polycrystalline p-type CdTe material used as the absorber in a CdS/CdTe photovoltaic device is typically treated with Cl-containing liquids or vapors just prior to the formation of ohmic contact. The Cl treatments improved junction performance, but also can produce a CdTe surface that is rich in Cl. Furthermore, the formation of oxide layers from atmospheric oxygen or other processes can alter the chemical properties of the p-type CdTe surface. These factors can effect the electrical transport at the contact interface, and alter the characteristics of the ohmic contact.

To remove the contaminated outer surface of the p-type CdTe, wet chemical treatments are often used. In addition to removing unwanted contamination from the surface, these treatments often have the added benefit of forming a Te-rich layer at the surface, and this Te-layer assists in forming the ohmic contact.

Accordingly, there is a need in the art of preparing the back surface of CdS/CdTe thin-film photovoltaic devices, to minimize and/or eliminate the effect of variations and provide uniform reproducible surfaces on to which subsequent contact layers can be applied—first utilizing a "dry process" which is inherently compatible with in-line manufacturing and does not produce significant waste products.

The present invention encompasses the use of plasma etching and reactive ion etching to prepare the surface of p-type CdTe films to avoid wet chemical treatments and the problems associated therewith.

A heterojunction p-i-n photovoltaic cell having at least three different semiconductor layers formed of at least four different elements comprising a p-type wide band gap semiconductor layer, a high resistivity intrinsic semiconductor layer, used as an absorber of light radiation, and an n-type wide band gap semiconductor layer is disclosed in U.S. Patent 4,710,589. The intrinsic layer is in electrically conductive contact on one side with the p-type layer and on an opposite side with the n-type layer. First and second ohmic contacts are in electrically conductive contact with the p-type layer and the n-type layer.

U.S. Pat. No. 4,766,084 discloses a process for producing an electric contact on a HgCdTe substrate having a P conductivity and application to the production of an N/P diode, and specifically uses ion bombardment for removal etching of $SiO_2$ insulator layer.

A process for replacement of chemical etching with a process involving $CF_4$ plasma etching plus heat treatment to form an improved gate area in n-type α-Si on top of intrinsic α-Si is disclosed in U.S. Pat. No. 4,581,099.

U.S. Pat. No. 5,002,632 discloses combining remotely created $Ar^+$metastable species with reactant gas near to the substrate to avoid contamination and etching of the reactor vessel and associative hardware.

The use of radiation of wavelength shorter than 436 nm to assist in plasma ignition for low-pressure/closer-plate-spacing situations is disclosed in U.S. Pat. No. 5,246,529.

SUMMARY OF THE INVENTION

One object of the invention is to provide improved photovoltaic device performance by decreasing the losses associated with the back contact by preparing the surface of p-CdTe films utilizing a method which avoids wet chemical treatments.

Another object of the present invention is to provide surfaces of p-type CdTe films for application of ohmic contacts that have not been prepared using wet chemical treatments, but instead, using plasma etching.

Another object of the invention is to provide surfaces of p-type CdTe films for application of ohmic contacts that have not been prepared utilizing wet chemical treatments, but instead, using reactive ion etching.

In general, the invention is accomplished by placing a CdS/CdTe sample into a chamber capable of evacuation to pressures <1e−3 torr through the use of appropriate vacuum pumps. The sample is oriented on a sample holder with the p-CdTe side of the sample facing the plasma region (p-CdTe side up). The sample may be positioned on a sample holder that can allow for sample heating or cooling, and in the case of Reactive Ion Etching (RIE), the sample holder is equipped to provide a radio-frequency (r.f.) bias by the use of a power supply, capacitive matching network, electrical feedthroughs, and electrical insulation. Once the sample is loaded into the processing chamber, the chamber is evacuated to an appropriate base pressure.

In the case of Plasma Etching (PE) and Reactive Ion Etching (RIE), a base vacuum pressure is established within the processing chamber, whereupon the chamber is back-filled with Ar and optionally, other reactive gas species to a pressure appropriate for plasma ignition and operation (~1e−2 torr). The plasma is generated in this rarefied gas mixture by energizing the cathode via connection to a power supply. The plasma generates various energetic gas species (electrons, atomic neutrals & ions), and these interact with the p-CdTe surface to alter the near surface chemistry.

Following the plasma processing, deposition of appropriate contact layers should be performed before the plasma processed CdTe surface is exposed to air or other contamination.

BRIEF DESCRIPTION OF THE DRAWINGS

A more complete appreciation of the invention and the advantages attendant thereof will be obtained by reference to the detailed description when considered in connection with the accompanying drawings, wherein:

FIG. 2 illustrates one of the basic problems with contacting semiconductor materials such as p-CdTe and p-ZnSe.

FIG. 3 shows an energy-band diagram illustrating the function of an CIFL in an idealized situation where the position of the Fermi level at the p-CdTe surface is not pinned or affected artifacts of contamination.

FIG. 7 shows scanning-electron microscope (SEM) images illustrating effects of wet chemical process on polycrystalline CdTe films.

FIG. 8 shows XPS surface scans illustrating the effect of bombardment of single crystalline p-CdTe with 500 eV Ar neutrals.

FIG. 9 shows a schematic diagram of a typical Reactive-Ion Etching (RIE) system of the invention process. In this invention, the sample is placed into a vacuum chamber on a temperature-controlled stage/electrode that is attached to radio-frequency (r.f.) power supply through an appropriate capacitive matching network. The chamber is evacuated using appropriate vacuum pumps and the chamber walls are electrically connected to ground (Voltage=0). When the stage/electrode is energized by the power supply, positively charged Ar ions are produced in the plasma region above the sample. Ions at the outer edge of the plasma region are accelerated toward the sample stage and sample surface by the d.c. self-bias potential that is assumed by the sample stage due to the high r.f. frequency used to drive the sample stage. The self-bias potential is of sufficient voltage (typically 50–1000 V)to produce energetic bombardment of the p-CdTe surface by Ar ions. This bombardment causes changes in the surface stoichiometry of the p-CdTe similar to those noted in the previous figure. Through proper control of the RIE process parameter, p-CdTe surface stoichiometries advantageous for ohmic contact formation result. In addition to relying only on Ar ions for bombardment of the p-CdTe surface, other gas species may be optionally added to the gas flow of the vacuum system to yield p-CdTe surfaces with stoichiometries advantageous for ohmic contact.

FIG. 10 shows a schematic diagram of a typical plasma etching (PE) system. A sample is placed in a vacuum chamber on a temperature-controlled, sample stage/electrode. The chamber is evacuated using appropriate vacuum pumps. Typically, the sample stage/electrode, as well as the chamber walls, are electrically connected to ground (Voltage=0). Optionally, the sample stage/electrode can be disconnected from ground and allowed to assume voltages between ground and plasma potential (i.e., floating potential). Optionally, the sample stage/electrode can be disconnected from ground and connected to a d.c. voltage source (using an appropriate r.f. choke circuit) and allowed to assume a d.c. voltage). A second electrode that is electrically isolated from the chamber walls and the sample stage/electrode typically is placed in the vacuum chamber above the sample stage/electrode and is powered by a radio-frequency power supply with a frequency of ~30 kHz. If Ar or other gas species are allowed to enter the chamber at appropriate pressures, a plasma will be generated containing various energetic gas species (e.g., electrons, atomic neutrals, and ions) in the region between the driven electrode and the sample. Because of the relatively low r.f. frequency used, and the small distance between the sample stage/electrode and the r.f. powered electrode, the plasma species generated between these electrodes will be able to "follow the r.f. field" and bombard the sample surface with energies up to a maximum peak voltage produced at the r.f. powered electrode. These plasma species will interact and modify the sample surface. Control of process parameters will produce modifications on the p-CdTe surface that are advantageous for ohmic contact formation.

FIG. 11 shows surface reactions of a potential plasma etching (PE) process that can be used with polycrystalline CdTe. The resultant CdTe surface is more appropriate for the formation of ohmic contact. The first reaction illustrates how Cl-containing gas can be admitted into a PE system containing a polycrystalline CdTe sample. The temperature of the sample stage/electrode is controlled to achieve appropriate interaction of the Cl-containing gas and the sample so that the device performance is improved. During the process, plasma interactions may be used to form Cl species that interact more effectively with the sample surface, and/or interact at a lower temperature. This reaction is represented by Equation 1. Following treatment of the sample in a Cl-containing ambient, the sample will be coated with a layer of species rich in Cl (e.g., $CdCl_2$). To avoid processes inconsistent with later contact processing steps (e.g., to avoid wet processing), a second set of plasma conditions can be used to remove the Cl-rich layers. A potential plasma process is presented by Equation 2 in which an Ar plasma physically bombards the sample surface and removes the Cl-rich layer.

DESCRIPTION OF THE PREFERRED EMBODIMENTS

The invention as described hereafter with reference to a photovoltaic cell using polycrystalline semiconductors, is a preferred embodiment. However, the invention is applicable to any semiconductor device wherein a layer of metal is used to make a low-resistance contact to p-type crystalline CdTe, as well as photovoltaic cells.

Figure 1:
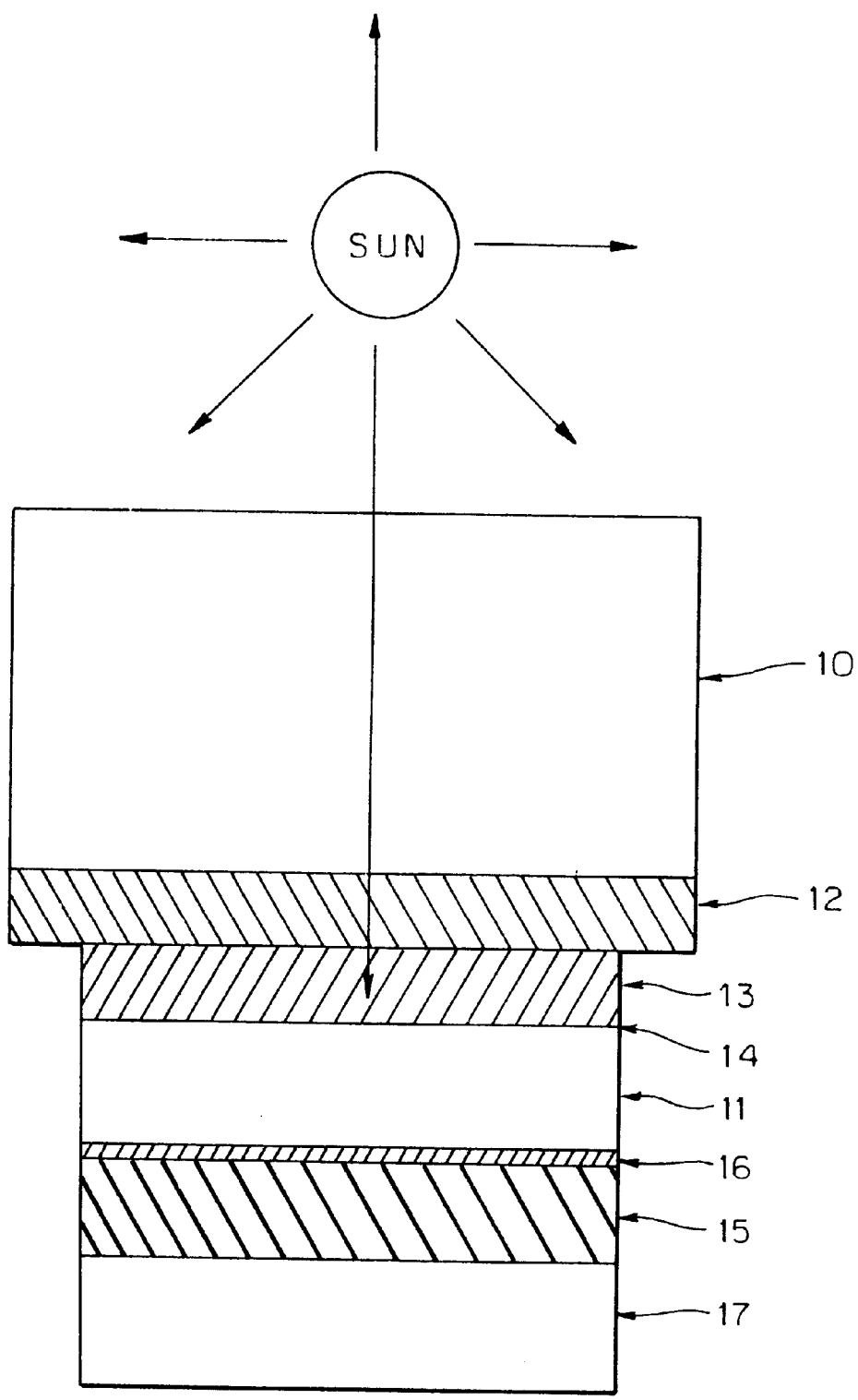
FIG. 1 shows the various layers of a typical CdS/CdTe solar configuration.
Figures 2A, 2B:
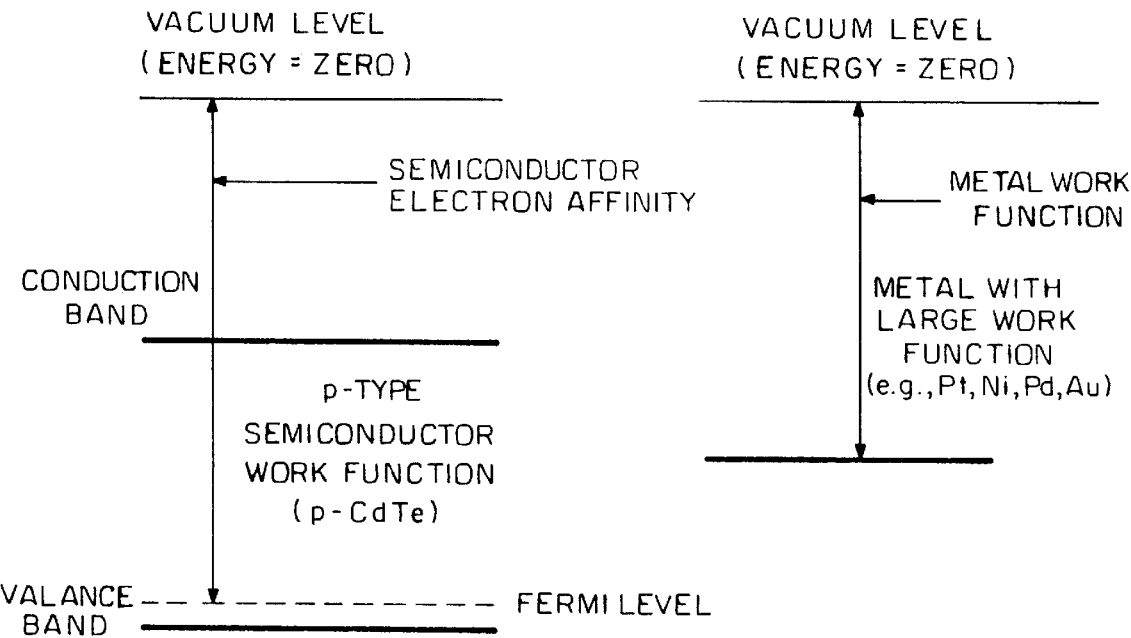
FIG. 2a shows the position, relative to the vacuum level (energy=zero), of the conduction-band, valance band, and Fermi levels for a semiconductor such as p-CdTe.
FIG. 2b shows, in approximate relationship to the energy levels of the semiconductor, the energy level (i.e., metal work function) that would be associated with a typical metal having a high work function (>5.0 eV).
Figure 2C:
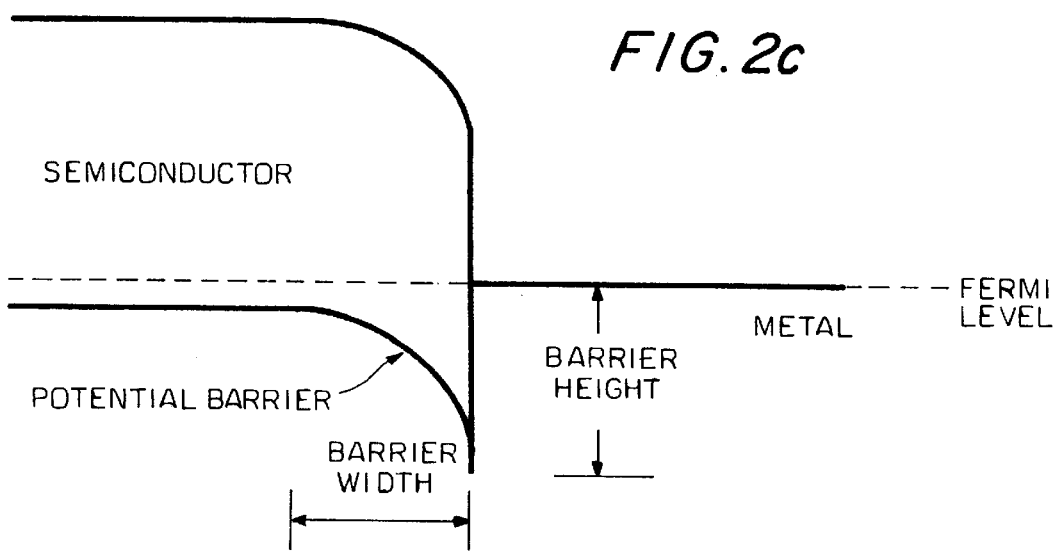
As illustrated in FIG. 2c, when the p-CdTe semiconductor and the high-work function metal are brought into intimate contact, the Fermi level near the surface of the semiconductor will equilibrate with the position of the metal work function. This will cause the conduction and valance bands of the semiconductor to bend downward and form a barrier, as shown in the figure. Depending upon the specific material and electrical properties of the semiconductor and the metal, the barrier will have a specific "width" and "height" as shown in the figure. For the case of p-CdTe and typical metals, the charge carriers will have insufficient energy to flow over the barrier, thus limiting current transport between the metal and semiconductor. This limitation will lead to contact resistance in solar cell that can become a part of the total series resistance of the solar cell, and thereby limit cell performance. Note that if a metal with a smaller of work function is chosen, the barrier height will be even larger, further limiting cell performance. Typically, the resistance associated with this type of contacting problem can be minimized by producing has a very high p-type carrier concentration in the region in the p-CdTe immediately adjacent the metal. This technique will produce a barrier width that is sufficiently narrow to allow low resistance charge transport across the barrier by the process known as quantum-mechanical tunneling. However, because the maximum p-type carrier concentration is limited by compensation mechanisms, low-resistance tunneling has not been demonstrated between metals and p-CdTe.
Figure 3:
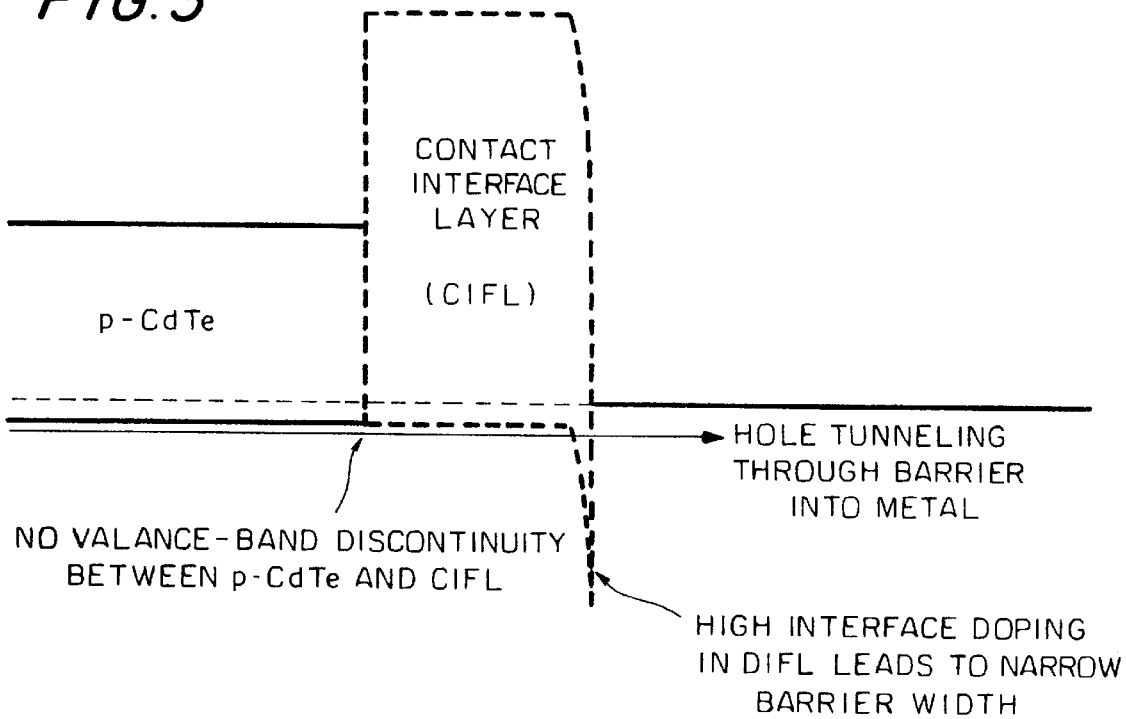
FIG. 3 shows an energy-band diagram illustrating a resolution of the problems associated with forming low-resistance ohmic contact to p-CdTe. In this technique, a contact interface layer (CIFL) is placed between the p-CdTe and the outer metallization. For the case of ohmic contact to p-CdTe, the CIFL is chosen so that it produces a small discontinuity at the valence band. The CIFL is also chosen so that it can be fabricated to have a sufficiently high p-type carrier concentration to facilitate quantum-mechanical tunneling of charge between the CIFL and outer metallization. Because of its material and electrical properties, the semiconductor p-ZnTe has been shown to be a useful CIFL for this application.
Figure 4:
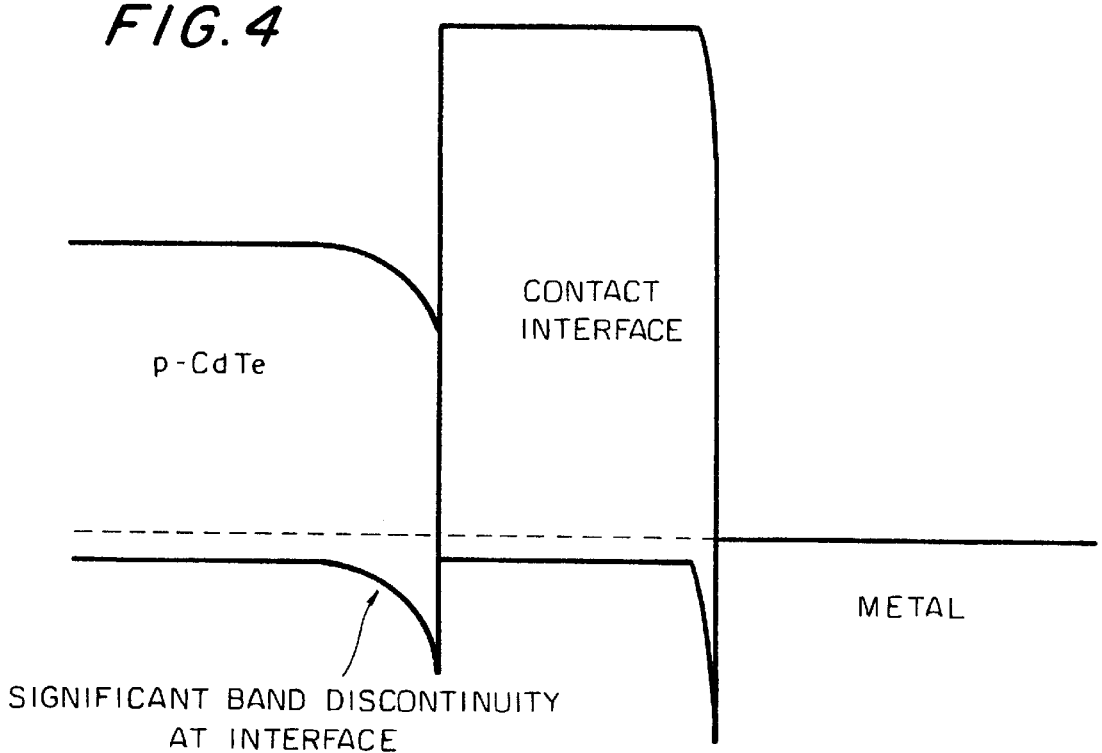
FIG. 4 shows an energy-band diagram illustrating a barrier at the p-CdTe/CIFL that forms if the Fermi level at the p-CdTe surface is pinned toward mid gap by the presence of artifacts due to intrinsic interface states, interface mixing, residual surface layers, or contamination. In tis situation, although current transport at the CIFL/metal interface can proceed via low-resistance tunneling, significant resistance in the contact remains because of the potential barrier formed at the p-CdTe/CIFL interface. It is the reduction or elimination of this barrier that is the object of this invention.
Figure 5A:
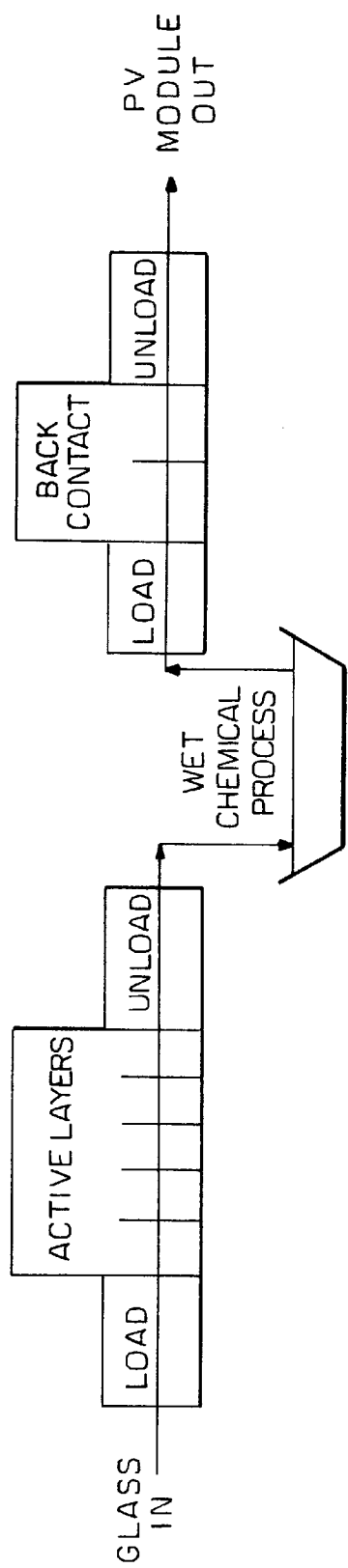
FIG. 5 shows a flow diagram illustrating the state-of-the-art process sequence for CdS/CdTe photovoltaic cell manufacture and a flow diagram illustrating an improved process sequence that results from the incorporation of this invention. The diagrams show that by eliminating the wet chemical process, some components of the process sequence can be eliminated, and the process can be streamlined. Further, by replacement of the wet chemical process with a dry process such as those described by this invention, process reproducibility will be improved and chemical waste will be reduced.
Figure 5B:
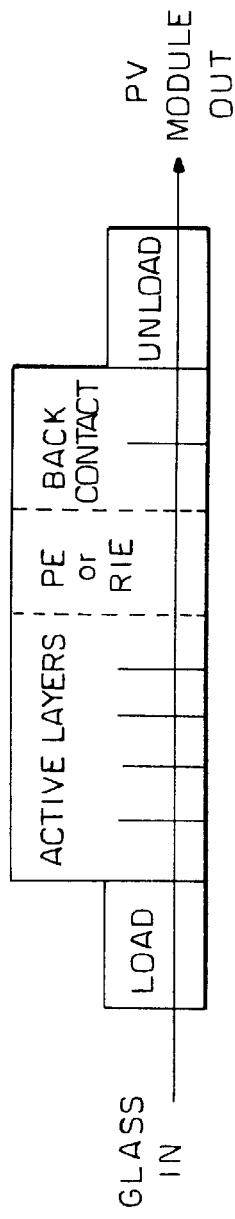
Figure 6:
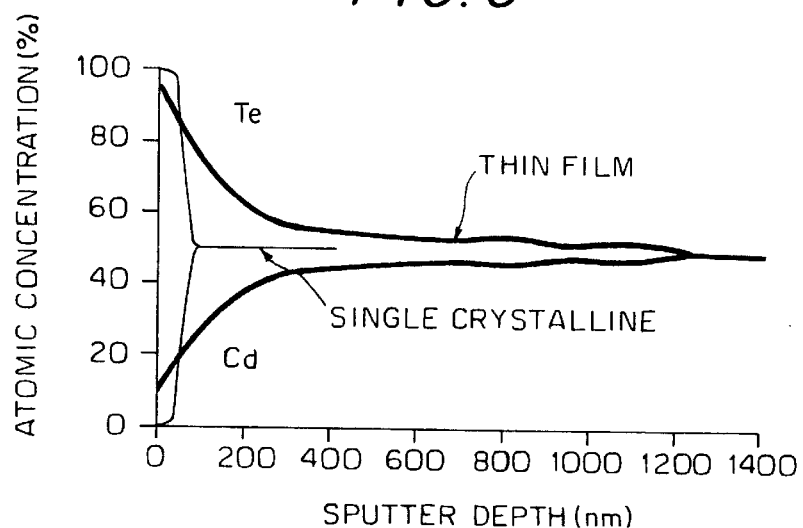
FIG. 6 is an x-ray photoelectron spectroscopy (XPS) depth profile illustrating the effects of a wet chemical process on the single crystalline and polycrystalline CdTe. The figure shows that a wet chemical etch composed of $HNO_3:85H_3PO_4:33H_2O$ will form a Te-rich layer on the surface of both single crystalline and polycrystalline CdTe. The figure shows that the depth of the Terich region extends farther into the bulk of the polycrystalline material than for the single crystalline material. Although the Te-rich region formed by the wet chemical etching assists the formation of ohmic contact, the extent to which the p-CdTe is effected is dependent on etching parameters, and these are often difficult to control. For this reason, the reproducibility of wet chemical processes is viewed as inferior compared to the dry processes, such as those described by this invention.
Figure 8A:
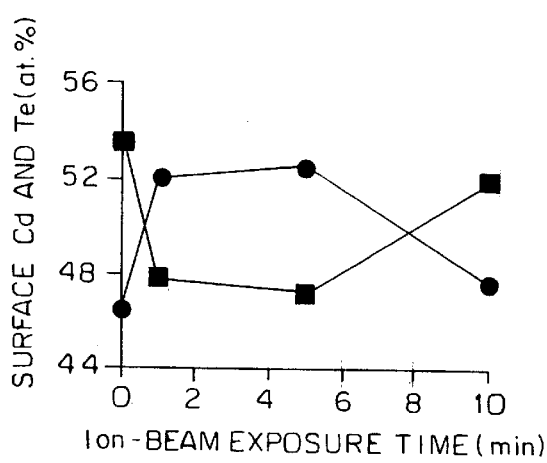
FIG. 8a shows that for the bombardment conditions used, the surface stoichiometry can be altered from Cd-rich, to Te-rich within exposure times of <1 min. However.
Figure 8B:
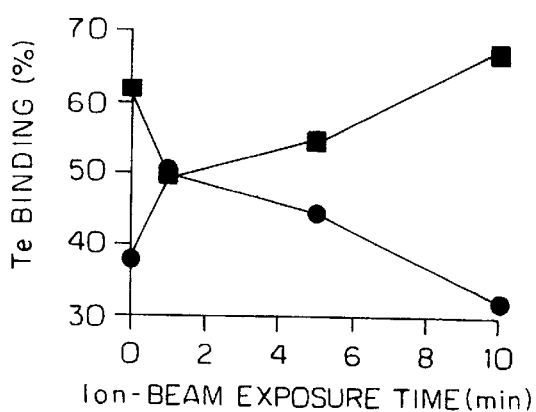
FIG. 8b shows that, for exposure times >1 min., the surface become increasingly likely to form oxides. The data indicate that, with proper control of exposure time, exposure to energetic Ar atoms can yield p-CdTe surface stoichiometries advantageous for ohmic contact formation.
Figure 7A:
FIG. 7a shows a cross-section view of a polycrystalline CdTe film before wet chemical processing.
Figure 7B:
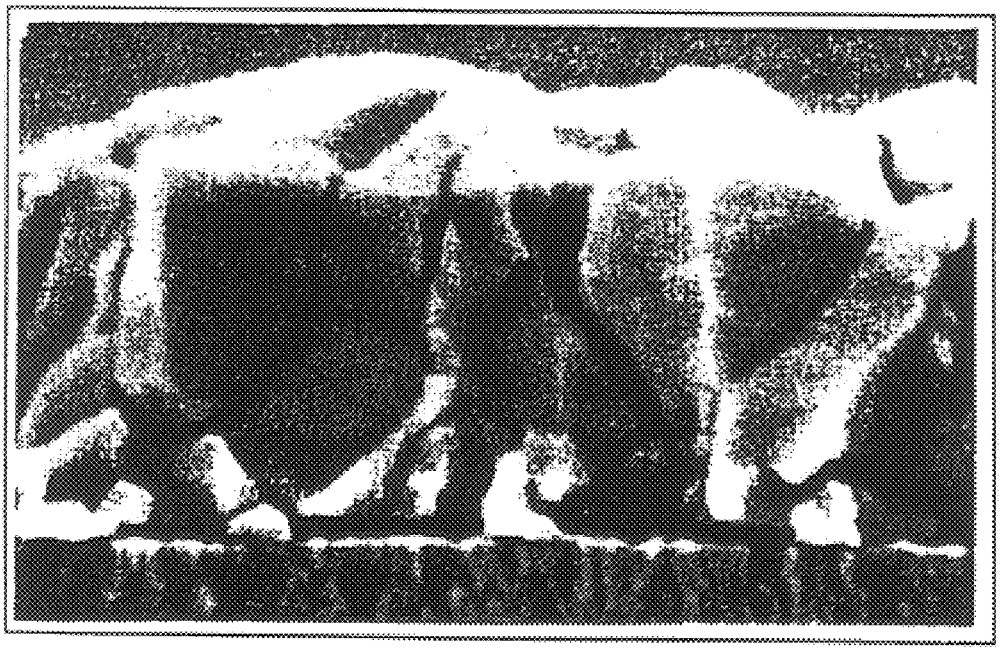
FIG. 7b. shows a cross-section view of a polycrystalline CdTe film that has been etched for 5 minutes using $HNO_3:85H_3PO_4:33H_2O$. The photographs illustrates that this wet chemical processing leads to preferential etching along grain boundaries. The resultant grain boundary etching may enhance diffusion of materials from the back contact toward the junction region. It is well known that significant diffusion of certain metals (such as Cu) into the junction region can lead to losses in cell performance and to long-term instability. Because the dry processes indentified in this invention predominantly effects only the surface of the polycrystalline CdTe, grain-boundary etching is avoided and related diffusion concerns minimized.

FIG. 1 shows the various layers of a typical CdS/CdTe solar configuration.

In this configuration, light enters through the glass substrate 10. The substrate is typically called a superstrate when the cell is designed to have the light incident on the substrate side. The light is absorbed predominantly in the p-CdTe layer 11. The figure shows the location of the transparent-conducting oxide (TCO) layer 12 that forms the transparent electrical top contact to the n-type CdS layer 13, and the location of the semiconductor n-p junction 14 between the n-CdS and p-CdTe. The figure shows the location of a contact-interface layer (CIFL) 15 that optionally may be placed between the CdTe and an outer back metallization to improve the performance of the contact. The interface 16 between the CdTe and the CIFL is where the plasma etching or reactive-ion etching process is applied prior to deposition of the CIFL and/or back metallization or metal back contact 17.

EXAMPLE

A CdS/CdTe is placed into a chamber and evacuated to pressures <1e−3 torr using appropriate vacuum pumps. The sample is oriented on a sample holder with the p-CdTe side of the sample facing the plasma region (p-CdTe side up). The sample is positioned on the sample holder to allow for sample heating or cooling. In the case of Reactive Ion Etching (RIE), the sample holder is disposed to provide a radio-frequency (r.f.) bias by an appropriate power supply, capacitive matching network, electrical feedthroughs, and electrical insulation. After the sample is loaded into the processing chamber, the chamber is evacuated to an appropriate base pressure.

After the base vacuum pressure is established within the processing chamber, the chamber is backfilled with Ar and any other reactive gas species through pressure appropriate for plasma ignition and operation (~1e−2 torr). The plasma generates energetic gas species (e.g. electrons, atomic neutrals and ions), and these various energetic gas species interact with the p-CdTe surface to alter the near surface chemistry.

Several process parameters affect the type and extent of alteration of the p-CdTe surface, and thereby effect the performance of the resultant PV device. These parameters include the time of plasma exposure, plasma power, gas species, gas chamber pressure, gas flow rate, substrate bias level (in the case of RIE), and substrate temperature.

The method of preparing the low-resistance electrical contact on the layer of polycrystalline p-type CdTe surface places the CdS/CdTe sample into a chamber and evacuates the chamber to a vacuum of ~1e−3-torr, whereupon the chamber is back-filled with Argon at a pressure of about ~1e−2 torr, whereupon plasma ignition by an energizing cathode connected to a power source to about 30 kHz (or 13.56 MHz in the case of RIE) is affected to enable the plasma to interact Argon ions at a range of between about 50–2000 eV with a p-CdTe surface.

Following the plasma processing, it is important to deposit appropriate contact layers before the plasma-processed surface of the p-CdTe is exposed to air or other contamination.

While the invention has been described in detail with reference to preferred embodiments, it is to be understood that variations and modifications can be effected with the scope of the invention, without departing from the spirit of the invention.

What is claimed is:

1. In the process of making a photovoltaic cell, the improvement comprising a dry process of making electrical contact between a metal and a layer of polycrystalline p-type CdTe surface by plasma etching comprising:
    a) placing a CdS/CdTe device into a chamber and evacuating said chamber;
    b) backfilling the chamber with Argon to a pressure sufficient for plasma ignition;
    c) generating plasma ignition by energizing a cathode connected to a power supply to enable plasma species of Ar ions to interact at an interface between the polycrystalline p-CdTe and a back contact layer to predominately etch only the surface of the polycrystalline p-CdTe to avoid grain-boundary etching; and
    d) depositing a back contact layer before the plasma-processed surface is exposed to air or other contamination.

2. The process of claim 1 wherein said chamber is evacuated to a vacuum of $10^{-3}$ torr prior to backfilling with Ar.

3. The process of claim 2 wherein said power supply is about 30 kHz.

4. The process of claim 3 wherein the Argon ion energy is between 50–2000 eV.

5. The process of claim 4 wherein said pressure sufficient for plasma ignition is about $\sim 10^{-2}$ torr.

6. In a process of making a photovoltaic cell, the improvement comprising a dry process of making electrical contact between a metal and a layer of polycrystalline p-type CdTe surface by reactive ion etching comprising:
    a) placing a CdS/CdTe layer into a chamber and evacuating said chamber;
    b) backfilling the chamber with Argon to a pressure sufficient for plasma ignition;
    c) generating plasma ignition by energizing a cathode connected to a power supply to enable plasma species of Ar ions to interact at an interface between the polycrystalline p-CdTe and a back contact layer to predominately etch only the surface of the p-CdTe to avoid grain-boundary etching in the presence of a radio-frequency DC self-bias voltage; and
    d. depositing a back contact layer before the plasma-processed surface is exposed to air or other contamination.

7. The process of claim 6 wherein said chamber is evacuated to a vacuum of $<10^{-3}$ torr prior to backfilling with Ar.

8. The process of claim 7 wherein the frequency of said power supply is about 13.56 MHz.

9. The process of claim 8 wherein the Argon ion energy is between about 50–2000 eV.

10. The process of claim 9 wherein said pressure sufficient for plasma ignition is about $\sim 10^{-2}$ torr.

* * * * *